(12) United States Patent
 Kouassi et al.

(10) Patent No.: US 12,677,432 B1
(45) Date of Patent: Jul. 7, 2026

(54) FET FIN AND VERTICAL NANOSHEET FORMATION USING POROUS SEMICONDUCTORS

(71) Applicant: Murata Manufacturing Co., Ltd., Kyoto (JP)

(72) Inventors: Kouassi Sebastien Kouassi, San Diego, CA (US); Sinan Goktepeli, Austin, TX (US); Panglijen Candra, San Diego, CA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 410 days.

(21) Appl. No.: 18/472,986

(22) Filed: Sep. 22, 2023

(51) Int. Cl.
 *H10D 30/01* (2025.01)
 *H10D 30/43* (2025.01)
 (Continued)

(52) U.S. Cl.
 CPC ......... *H10D 30/024* (2025.01); *H10D 30/014* (2025.01); *H10D 30/43* (2025.01);
 (Continued)

(58) Field of Classification Search
 CPC ................ H10D 30/01; H10D 30/014; H10D 30/019–0198; H10D 30/024;
 (Continued)

(56) References Cited

U.S. PATENT DOCUMENTS

| | | |
|---|---|---|
| 5,801,082 A | 9/1998 | Tseng |
| 8,652,888 B2 | 2/2014 | Cheng et al. |

(Continued)

OTHER PUBLICATIONS

Invitation to Pay Additional Fees And, Where Applicable, Protest Fee, Communication Relating to the Results of the Partial International Search Result, and Provisional Opinion Accompanying the Partial Search Result issued for International Patent Application No. PCT/JP2024/032392 filed on Sep. 10, 2024 on behalf of Murata Manufacturing Co., Ltd. Mail Date: Dec. 2, 2024. 13 pages.
Kouassi, et al., "Shallow Trench Isolation using Porous Semiconductor", application filed in the USPTO dated Aug. 17, 2023, U.S. Appl. No. 18/451,542, 31 pgs.

(Continued)

*Primary Examiner* — Cheung Lee
(74) *Attorney, Agent, or Firm* — Haynes and Boone, LLP

(57) ABSTRACT

Structures and corresponding methods of fabrication for ICs having fins and/or vertical nanosheets made by forming and etching a porous semiconductor (π-Semi) from a crystalline semiconductor. Embodiments include FinFETs and "gate-all-around" FETs. Such FET structures may be made by patterning an IC die to outline one or more regions of crystalline semiconductor material in the outline of a fin or nanosheet; converting the outlined regions to π-Semi having essentially vertical walls; further converting the outlined regions to π-Semi having flared walls; then selecting one of these options: etching the π-Semi to define fins, etching the π-Semi to define nanosheets with a residual π-Semi floor, or etching the π-Semi to define nanosheets with no residual π-Semi floor; and forming a gate structure over the fins or around the nanosheets. Additional steps and structures (e.g., formation of source and drain regions, formation of contacts, metallization layers, vias, etc.) may then be performed.

19 Claims, 15 Drawing Sheets

(51) Int. Cl.

| | |
|---|---|
| *H10D 30/62* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6211* (2025.01); *H10D 30/6735* (2025.01); *H10D 30/6757* (2025.01); *H10D 62/121* (2025.01); *H10D 84/0167* (2025.01); *H10D 84/017* (2025.01); *H10D 84/0193* (2025.01); *H10D 84/038* (2025.01); *H10D 84/853* (2025.01)

(58) Field of Classification Search
CPC ................. H10D 30/43; H10D 30/435; H10D 30/501–509; H10D 30/62; H10D 30/6211; H10D 30/6735; H10D 30/674; H10D 30/6757; H10D 62/121; H10D 84/01; H10D 84/0158; H10D 84/0167; H10D 84/017; H10D 84/0193; H10D 84/038; H10D 84/8311; H10D 84/8312; H10D 84/83135; H10D 84/83138; H10D 84/8314; H10D 84/8316; H10D 84/835; H10D 84/836; H10D 84/837–839; H10D 84/851–852; H10D 84/853
See application file for complete search history.

(56) References Cited

U.S. PATENT DOCUMENTS

| | | | |
|---|---|---|---|
| 9,595,579 B2 | 3/2017 | Feilchenfeld et al. | |
| 10,332,803 B1 * | 6/2019 | Xie | ...................... H10D 84/853 |
| 2008/0283917 A1 | 11/2008 | Cheng et al. | |
| 2013/0224915 A1 | 8/2013 | Sleight et al. | |
| 2023/0207624 A1 | 6/2023 | Gardner et al. | |
| 2023/0215768 A1 * | 7/2023 | Xie | ...................... H10D 62/118 |

OTHER PUBLICATIONS

Lee, Jack C., "FinFET Devices and Technologies", NCCAVS PAG Seminar Sep. 25, 2014, Material Opportunities for Semiconductors, 18 pgs.

Ye, et al., "The Last Silicon Transistor", Aug. 30, 2019, Spectrum. IEEE.Org, downloaded on Jun. 8, 2023 from IEEE Xplore, 6 pgs.

Gautier, et al., "Porous Silicon for Electrical Isolation in Radio Frequency Devices: A Review", Applied Physics Reviews, Rev. 1, 2014, 19 pgs.

Perez, Elisabet, "Fundamentals of Porous Silicon and Applications", Universitat Rovira I. Virgili, Design, Frabications and Characterization of Porous Silicon Multilayer Optical Devices, 2007, 22 pg.

Grigoras, et al., "Conformal Titanium Nitride in a Porous Silicon Matrix: A Nonomaterial for In-Chip Supercapacitors", Nano Eneger 26 (2016), pp. 340-345.

Wikipedia, "Porous Silicon", https://en.wikipedia.org/w/index.php?title=Porous_silicon&oldid=1145768090, last edited Mar. 20, 2023, 8 pgs.

* cited by examiner

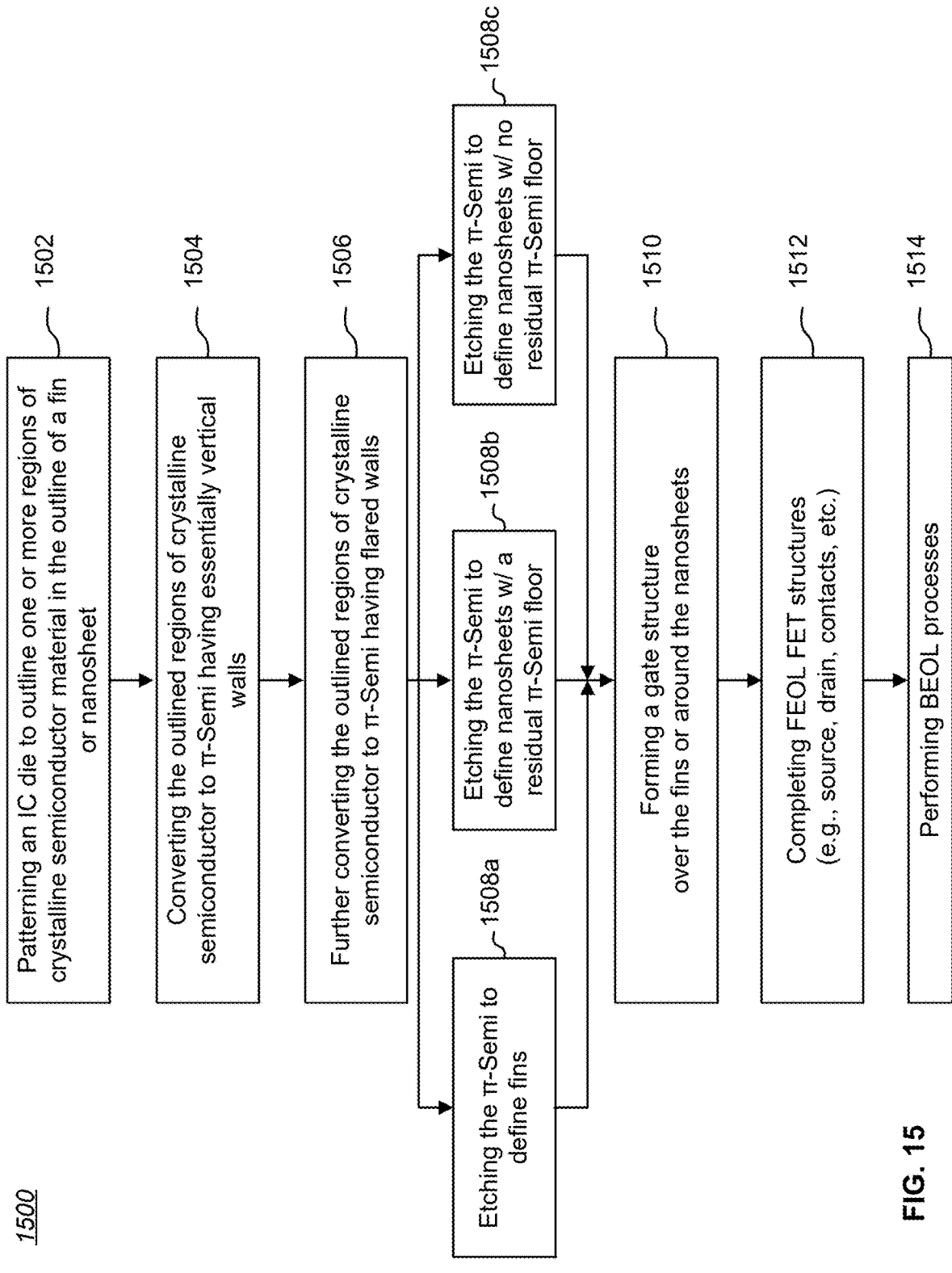

1500

1502  Patterning an IC die to outline one or more regions of crystalline semiconductor material in the outline of a fin or nanosheet 1504  Converting the outlined regions of crystalline semiconductor to π-Semi having essentially vertical walls 1506  Further converting the outlined regions of crystalline semiconductor to π-Semi having flared walls 1508a  Etching the π-Semi to define fins 1508b  Etching the π-Semi to define nanosheets w/ a residual π-Semi floor 1508c  Etching the π-Semi to define nanosheets w/ no residual π-Semi floor 1510  Forming a gate structure over the fins or around the nanosheets 1512  Completing FEOL FET structures (e.g., source, drain, contacts, etc.)

1514  Performing BEOL processes

FIG. 15

FET FIN AND VERTICAL NANOSHEET FORMATION USING POROUS SEMICONDUCTORS

BACKGROUND

(1) Technical Field

This invention relates to fabrication of semiconductor integrated circuits.

(2) Background

The electronics industry continues to strive for ever-increasing electronic functionality and performance in a wide variety of products, including (by way of example only) personal electronics (e.g., "smart" watches and fitness wearables), personal computers, tablet computers, wireless network components, televisions, cable system "set top" boxes, radar systems, and cellular telephones. Increased functionality and/or performance commonly translates to more transistors and other electronic components on an integrated circuit (IC) die. While the number of transistors per unit area of an IC die has increased over time as IC manufacturing process nodes have shrunk device dimensions, the two-dimensional (2-D) planar "footprint" of some IC dies has not decreased at the same rate, primarily owing to the use of more (albeit smaller) transistors to implement increased functionality and/or performance. The 2-D footprint of an IC die is one constraint on reducing the size of modules and circuit boards within products.

The predominant transistor technology for most modern electronic products is based on metal-oxide-semiconductor field-effect transistors (MOSFETs), which include a gate stack, a channel, a source, and a drain. MOSFETs come in N-type (NFET) and P-type (PFET) forms, and NFETs and PFETs are commonly paired as complementary MOSFETs (CMOS). Simply making each FET smaller to reduce the 2-D footprint of an IC die introduces new problems. In particular, as the channel of a FET becomes shorter, the influence of the drain voltage becomes larger, to the point that charge can leak to the source, tunneling under the region near the gate. The result was a transistor that was never completely OFF, wasting power and generating heat. One solution has been to make the channel region thinner, thus restricting the leakage path for charge to tunnel through, and to form the gate so as to surround the channel on more than one side. One embodiment of such a solution is the well-known FinFET architecture, in which the channel region is essentially tilted up on its side to form a slim fin of silicon etched between the source and the drain, thereby providing a wider path for current to flow through, and forming the gate stack around the fin so as to surround the fin on three sides instead of just one side. Some individual transistors may have multiple source-to-drain fins to increase current capacity. A number of variant architectures have been proposed, including FETs having stacked horizontal nanosheets spanning from source to drain.

A problem with conventional FinFETs is that the depth of the fins is limited, thus limiting IC die size reduction. A problem of the known variant architectures is that formation of stacked horizontal nanosheets is relatively complex (and thus costly). The present invention addresses the limitations of conventional FinFETs and FETs having stacked horizontal nanosheets.

SUMMARY

The present invention encompasses structures and corresponding methods of fabrication for ICs having fins and/or vertical nanosheets made by forming and etching a porous semiconductor (π-Semi) from a crystalline semiconductor, such as silicon (Si), germanium (Ge), or SiGe alloys. Applications of the present invention can produce FinFETs having deeper fins than conventional FinFETs, thus allowing a reduction in IC die size. Applications of the present invention can also produce "gate-all-around" FETs (GAAFETs) using vertical nanosheets formed using a simplified process compared to conventional FETs having stacked horizontal nanosheets or nanopillars.

FET structures in accordance with the teachings of this disclosure may be made by patterning an IC die to outline one or more regions of crystalline semiconductor material in the outline of a fin or nanosheet; converting the outlined regions of crystalline semiconductor to π-Semi having essentially vertical walls; further converting the outlined regions of crystalline semiconductor to π-Semi having flared walls; then selecting one of these options: etching the π-Semi to define fins, etching the π-Semi to define nanosheets with a residual π-Semi floor, or etching the π-Semi to define nanosheets with no residual π-Semi floor; and forming a gate structure over the fins or around the nanosheets. Additional steps and structures (e.g., formation of source and drain regions, formation of contacts, metallization layers, vias, etc.) may then be performed.

The details of one or more embodiments of the invention are set forth in the accompanying drawings and the description below. Other features, objects, and advantages of the invention should be apparent from the description and drawings, and from the claims.

DESCRIPTION OF THE DRAWINGS

FIG. 15 is a process flow chart showing one generalized method for fabricating FETs in accordance with the teachings of this disclosure.

Like reference numbers and designations in the various drawings indicate like elements unless the context requires otherwise.

DETAILED DESCRIPTION

Figure 1:
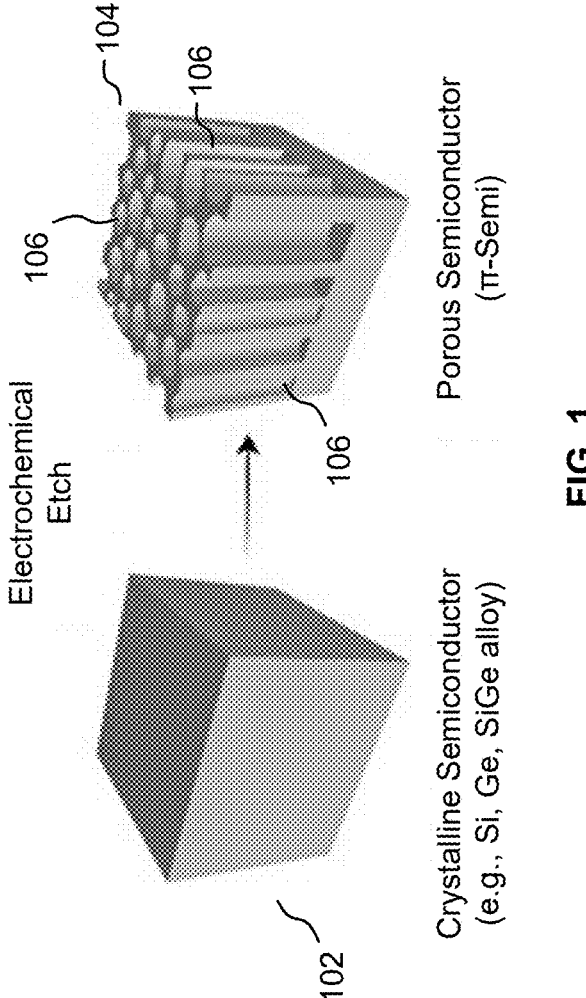
FIG. 1 is a stylized perspective view showing the transformation of crystalline semiconductor into π-Semi having a multitude of pores.

The present invention encompasses structures and corresponding methods of fabrication for ICs having fins and/or vertical nanosheets made by forming and etching a porous semiconductor (π-Semi) from a crystalline semiconductor, such as silicon (Si), germanium (Ge), or SiGe alloys. Applications of the present invention can produce FinFETs having deeper fins than conventional FinFETs, thus allowing a reduction in IC die size. Applications of the present invention can also produce "gate-all-around" FETs (GAAFETs) using vertical nanosheets formed using a simplified process compared to conventional FETs having stacked horizontal nanosheets.

It may be useful to review how typical metal-oxide-semiconductor FET (MOSFET) circuitry is fabricated using a conventional process. Starting with a wafer substrate, such as silicon, an active layer of crystalline semiconductor is formed, typically doped Si, Ge, or an SiGe alloy. In semiconductor-on-insulator (SOI) embodiments, an electrically insulating layer (e.g., a buried oxide or "BOX" layer) may be interposed between the wafer substrate and the active layer, possibly with an etch-stop material interposed between the insulating layer and the active layer. On and/or within the active layer, one or more MOSFET structures are formed within the bounds of an individual IC die (unsingulated at this point). Each wafer substrate typically includes hundreds to thousands of unsingulated dies.

A MOSFET structure generally includes a mask-formed channel, a gate, a source, a drain, and isolation regions such as shallow trench isolation (STI) structures. The IC fabrication process up to this point is generally considered "front-end-of-line" (FEOL) processing where individual devices (transistors, capacitors, resistors, inductors etc.) are patterned in or on the active layer. The FEOL generally covers everything up to (but not including) the deposition of metal interconnect layers, and may be regarded as fabrication of die substructures.

After the last FEOL step, a wafer contains multiple die regions each including isolated transistors without any interconnecting conductors. Back-end-of-line (BEOL) processing is the second portion of IC fabrication where the individual devices (transistors, capacitors, resistors, inductors, etc.) within a die region are interconnected with conductors formed as part of or spanning one or more metal interconnect layers. BEOL includes fabrication of electrical contacts (pads), vias, insulating layers (dielectrics), metallization layers, and bonding sites for die-to-package connections. In some applications, "through-substrate vias" (TSVs) may be fabricated, each TSV passing through the wafer substrate between the active layer and a connection point, such as a bond pad.

Thus, a MOSFET IC die is essentially formed in two parts, a "lower" FEOL substructure formed on a substrate and an "upper" BEOL superstructure formed on a substructure. After FEOL and BEOL processing, the wafer may undergo a number of additional process steps, including dicing, testing, and packaging, to form multiple IC dies.

One aspect of the present invention is the use of a porous semiconductor (π-Semi) formed from a crystalline semiconductor such as Si, Ge, or SiGe alloys, or any other suitable semiconductor that can be transformed to a porous structure. In general, exposed portions of a semiconductor active layer are subjected to an electrochemical etching to form π-Semi regions. In essence, the exposed in situ semiconductor is restructured to be a porous version. For example, FIG. 1 is a stylized perspective view showing the transformation of a crystalline semiconductor 102 into π-Semi 104 having a multitude of pores 106. Regions of π-Semi may be formed, for example, by anodic dissolution of exposed crystalline semiconductor within the active layer using hydrofluoric acid (HF) based electrolytes, which may include a number of different known additives (e.g., acetic acid, and surfactants or solvents such as ethanol) to control pore size, wettability, and etch rates. The etchant (e.g., electrolytes based on hydrofluoric acid) and etching conditions may be selected to form microporous π-Semi (pore diameters $\varphi$ less than about 2 nm), mesoporous π-Semi (pore diameters $\varphi$ between about 2 nm and 50 nm), or microporous π-Semi (pore diameters $\varphi$ greater than about 50 nm). Some known etchants are anisotropic, essentially etching only vertically, while other known etchants are isotropic, essentially etching both vertically and horizontally.

The examples below detail the steps and structure resulting from fabricating a several FET (NFET or PFET) substructures in an FEOL process in accordance with the present invention. Fabrication of mating superstructures may be by a conventional BEOL process.

Figures 2A, 2B:
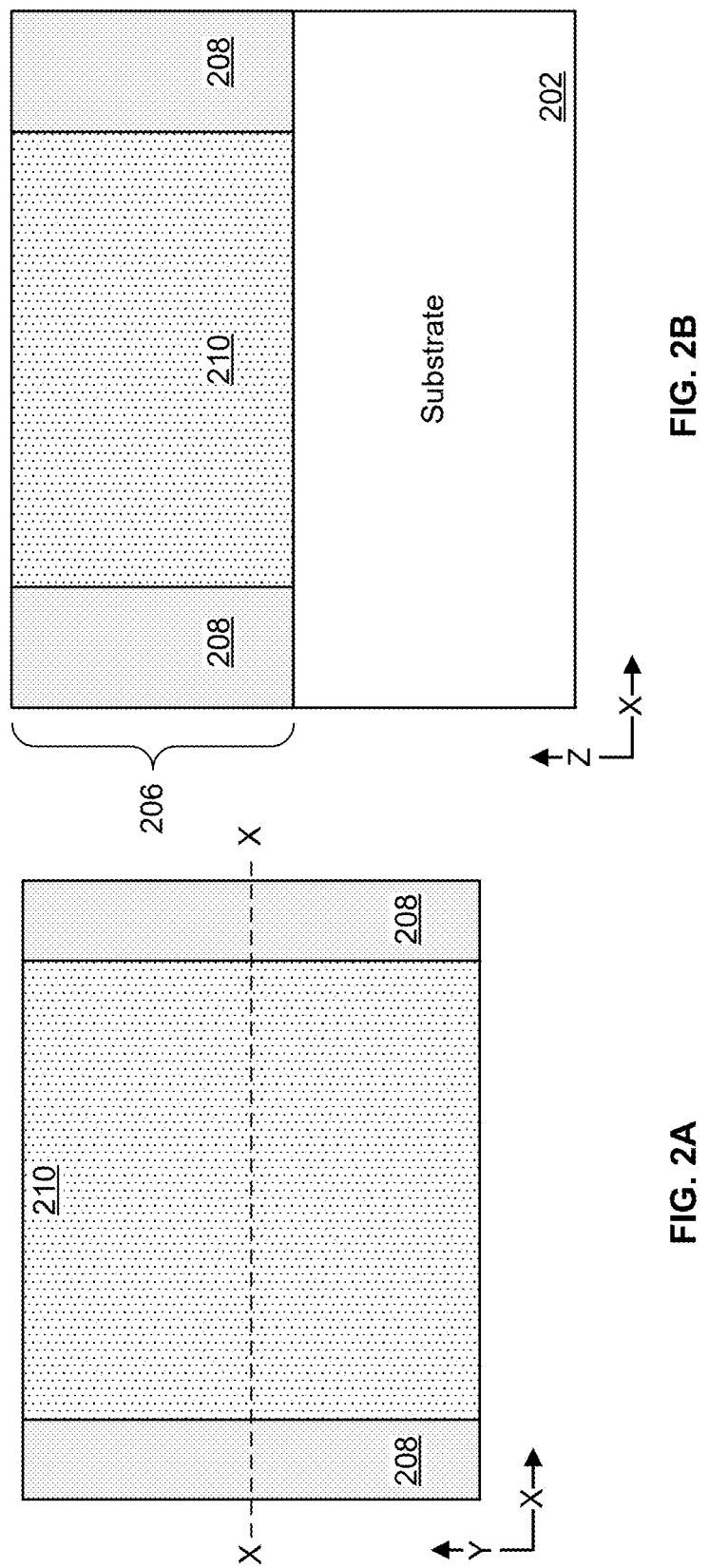
FIG. 2A is a top plan view of a first example FET substructure in a first stage of fabrication in accordance with the present invention.
FIG. 2B is a cross-sectional view of the FET substructure taken along line X-X of FIG. 2A.

FIG. 2A is a top plan view of a first example FET substructure 200 in a first stage of fabrication in accordance with the present invention. FIG. 2B is a cross-sectional view of the FET substructure 200 taken along line X-X of FIG. 2A. The FET substructure 200 includes an active layer 206 of semiconductor material (e.g., Si, Ge, SiGe) formed on the substrate 202. In the illustrated example, STIs 208 have been formed within the active layer 206 bracketing a semiconductor crystalline region 210. In some embodiments, the STIs 208 may completely surround the semiconductor crystalline region 210 in FIG. 2A. In some embodiments, the STIs 208 may be fabricated using a porous semiconductor in accordance with the teachings of U.S. patent application Ser. No. 18/451,542, filed Aug. 17, 2023, entitled "Shallow Trench Isolation using Porous Semiconductor", assigned to the assignee of the present application, the contents of which are hereby incorporated by reference.

Figures 3A, 3B:
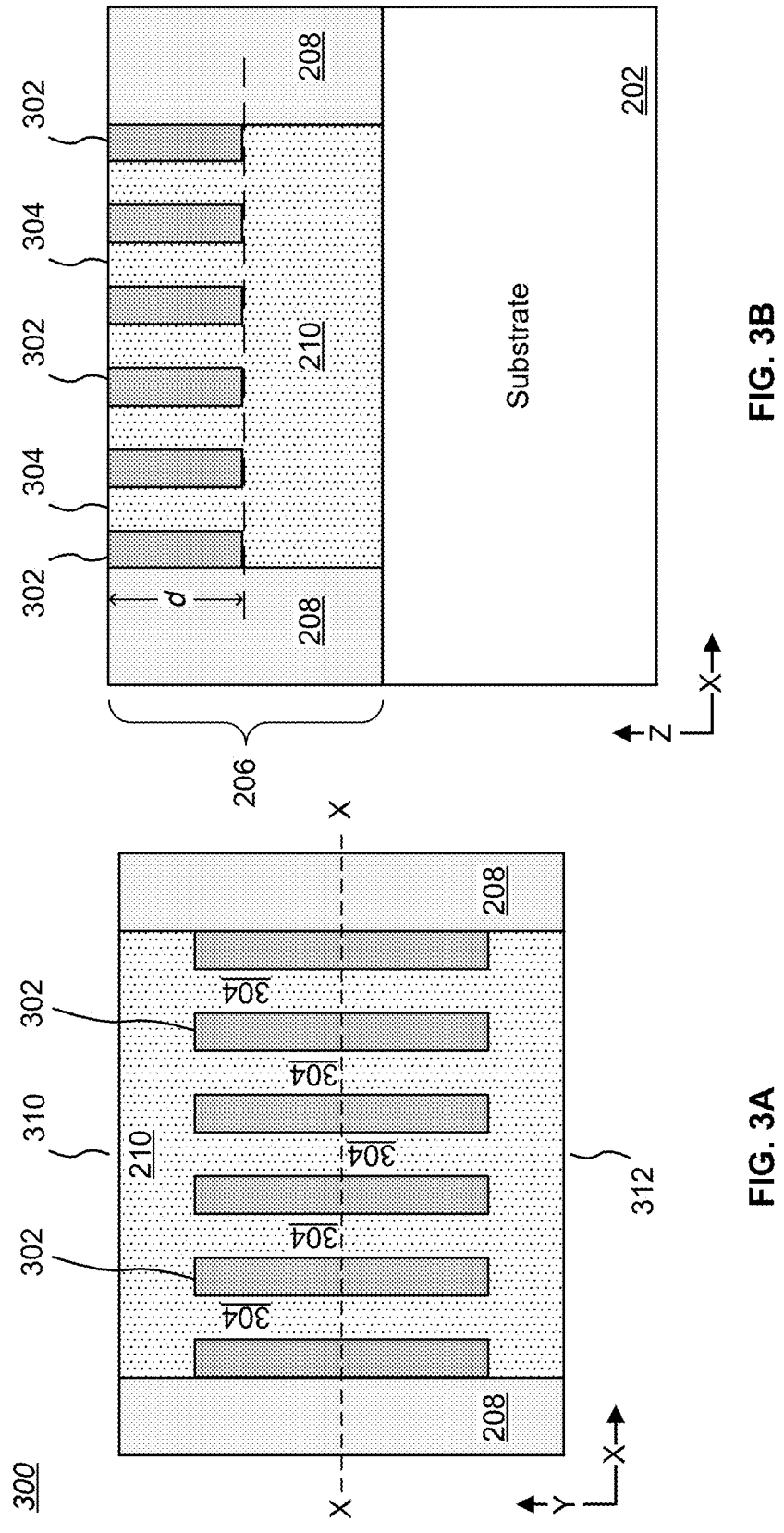
FIG. 3A is a top plan view of the first example FET substructure in a further stage of fabrication in accordance with the present invention.
FIG. 3B is a cross-sectional view of the FET substructure taken along line X-X of FIG. 3A.

FIG. 3A is a top plan view of the first example FET substructure 300 in a further stage of fabrication in accordance with the present invention. FIG. 3B is a cross-sectional view of the FET substructure 300 taken along line X-X of FIG. 3A. As shown in both figures, multiple regions 302 have been masked (applied to FIG. 3A) and then electrochemically etched anisotropically to convert the crystalline semiconductor to π-Semi, forming three-dimensional π-Semi regions having essentially vertical walls. The depth d of the regions 302 may be varied, for example, by timing the etching process, with longer times generally providing deeper π-Semi regions (with all other parameters held steady). However, other etching parameters may be varied to achieve a desired depth d.

In a preferred embodiment, the etching parameter values may be set to cause the porosity of the regions 302 to be mesoporous π-Semi. However, in other applications, the porosity of the regions 302 may be microporous or macroporous π-Semi. Note that regions 302 of π-Semi have not been removed at this stage, but do define at least one fin 304 of crystalline semiconductor connecting a first edge region 310 and a second region edge 312 of the original crystalline region 210 (five fins 304 are shown in FIGS. 3A and 3B). Since access to the sides of the fins 304 will be needed in succeeding steps, the number of π-Semi regions 302 will be one more than the number of fins 304.

Figures 4A, 4B:
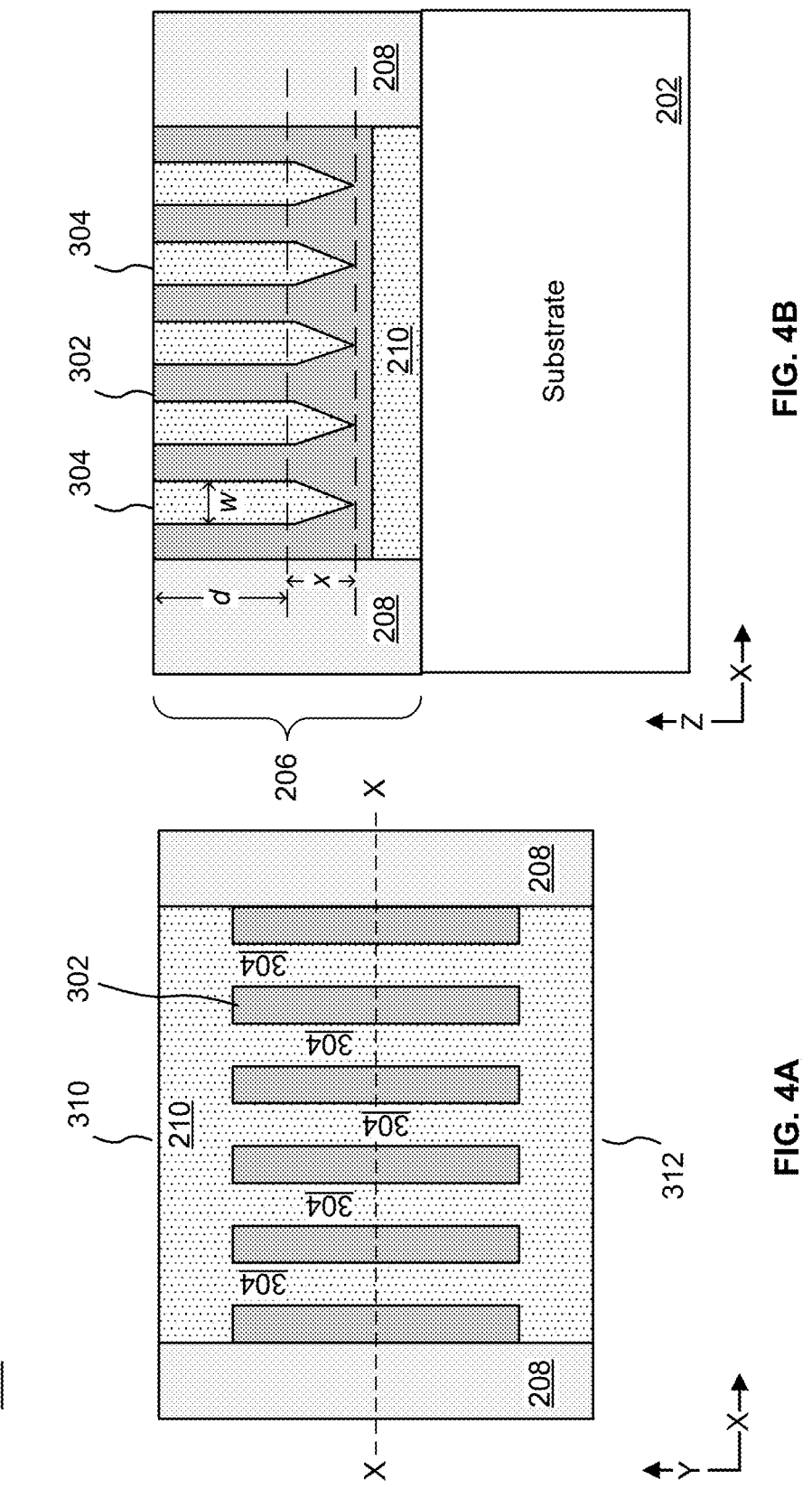
FIG. 4A is a top plan view of the first example FET substructure in a still further stage of fabrication in accordance with the present invention.
FIG. 4B is a cross-sectional view of the FET substructure taken along line X-X of FIG. 4A.

FIG. 4A is a top plan view of the first example FET substructure 400 in a still further stage of fabrication in accordance with the present invention. FIG. 4B is a cross-sectional view of the FET substructure 400 taken along line X-X of FIG. 4A. In a second phase of electrochemical etching step, the existing "columnar" regions 302 of π-Semi are further subjected to an isotropical etchant, thus extending the lower portion of each region 302 vertically and flaring each region 302 horizontally, in a generally conical shape. If etching proceeds long enough, adjacent "cones" will be joined along the Y-dimension of adjacent regions 302 as shown in FIG. 4B. Again, the regions 302 of π-Semi have not been removed at this stage, but do define at least one fin 304 of crystalline semiconductor (five fins 304 are shown in FIGS. 4A and 4B).

Note that the porosity of the "cone" portion of the regions 302 may differ from the porosity of the columnar portion of the regions 302 (i.e., the portion having a depth d). Thus, for example, the columnar portion of the regions 302 may be mesoporous or microporous π-Semi (low porosity) while the cone portion of the regions 302 may be mesoporous or microporous π-Semi (medium porosity). An advantage of varying etching rates in different layers of π-Semi is that it enables shaping the porous region (for example, to achieve the "cone" structure).

To give one example of scale, embodiments of the present invention may have fins 304 with a width w of 20 nm or less, a depth x for the "cone" portion of the regions 302 to the bottom of the fins 304 in the range of about 0-30 nm, with a total depth d+w in the range of about 50-500 nm (with 200-250 nm being typical). As FIG. 4B shows, the regions 302 may extend below the bottom of the fins 304.

Figures 5A, 5B:
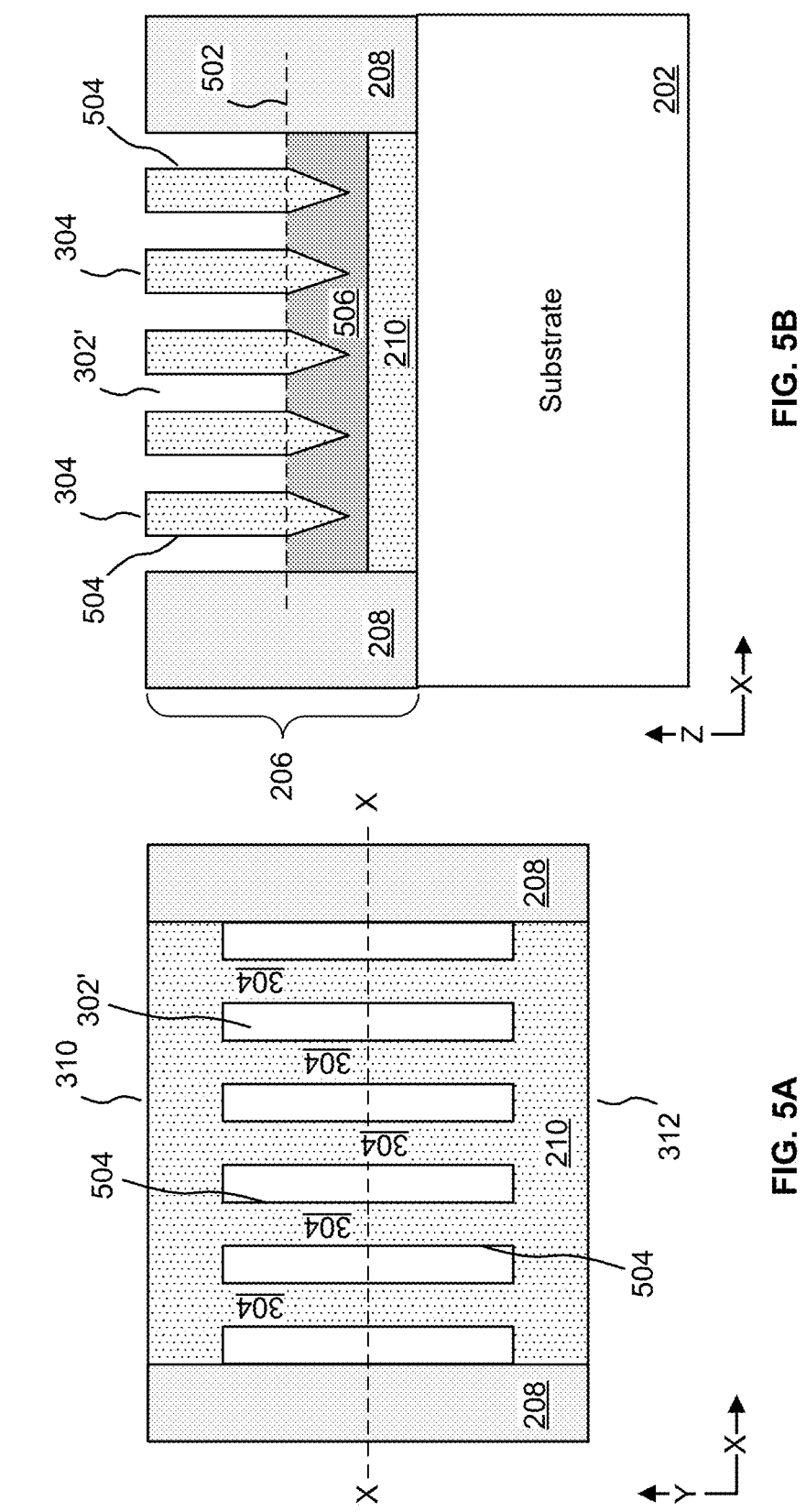
FIG. 5A is a top plan view of the first example FET substructure in an even further stage of fabrication in accordance with the present invention.
FIG. 5B is a cross-sectional view of the FET substructure taken along line X-X of FIG. 5A.

FIG. 5A is a top plan view of the first example FET substructure 500 in an even further stage of fabrication in accordance with the present invention. FIG. 5B is a cross-sectional view of the FET substructure 500 taken along line X-X of FIG. 5A. In this stage, the upper portion (above dashed line 502) of the π-Semi regions 302 have been masked and etched away to a desired depth, thus converting part of the regions 302 to voids 302' on either side of the fins 304, thereby exposing the sides 504 of the fins 304. In this example, a residual portion 506 of π-Semi remains at the bottom of the voids 302'. The result in this example is that 5 fins 304 having exposed sides 504 connecting the first edge region 310 and the second region edge 312 of the original crystalline region 210.

Note that FIG. 5A seems to show the voids 302' as being empty, but even though the π-Semi is removed from the upper portion of the regions 302 (thus creating the voids 302'), in this example there is still the residual portion 506 of π-Semi below dashed line 502.

It may be desirable in some embodiments to seal the tops of the pores of the π-Semi at the bottom of the voids 302'. Sealing the tops of the π-Semi pores protects them from contamination in later FEOL stages that might adversely affect the electrical characteristics of the remaining π-Semi and helps preserve the structural integrity of the remaining π-Semi. The exposed portions of the π-Semi may be subjected to a substance, such as argon (Ar) or hydrogen ($H_2$) gas, that rearranges or converts the atomic structure of the π-Semi near the top of the residual portion 506 of π-Semi back into crystalline semiconductor, thereby forming a protective cap of recrystallized semiconductor.

Figures 6A, 6B:
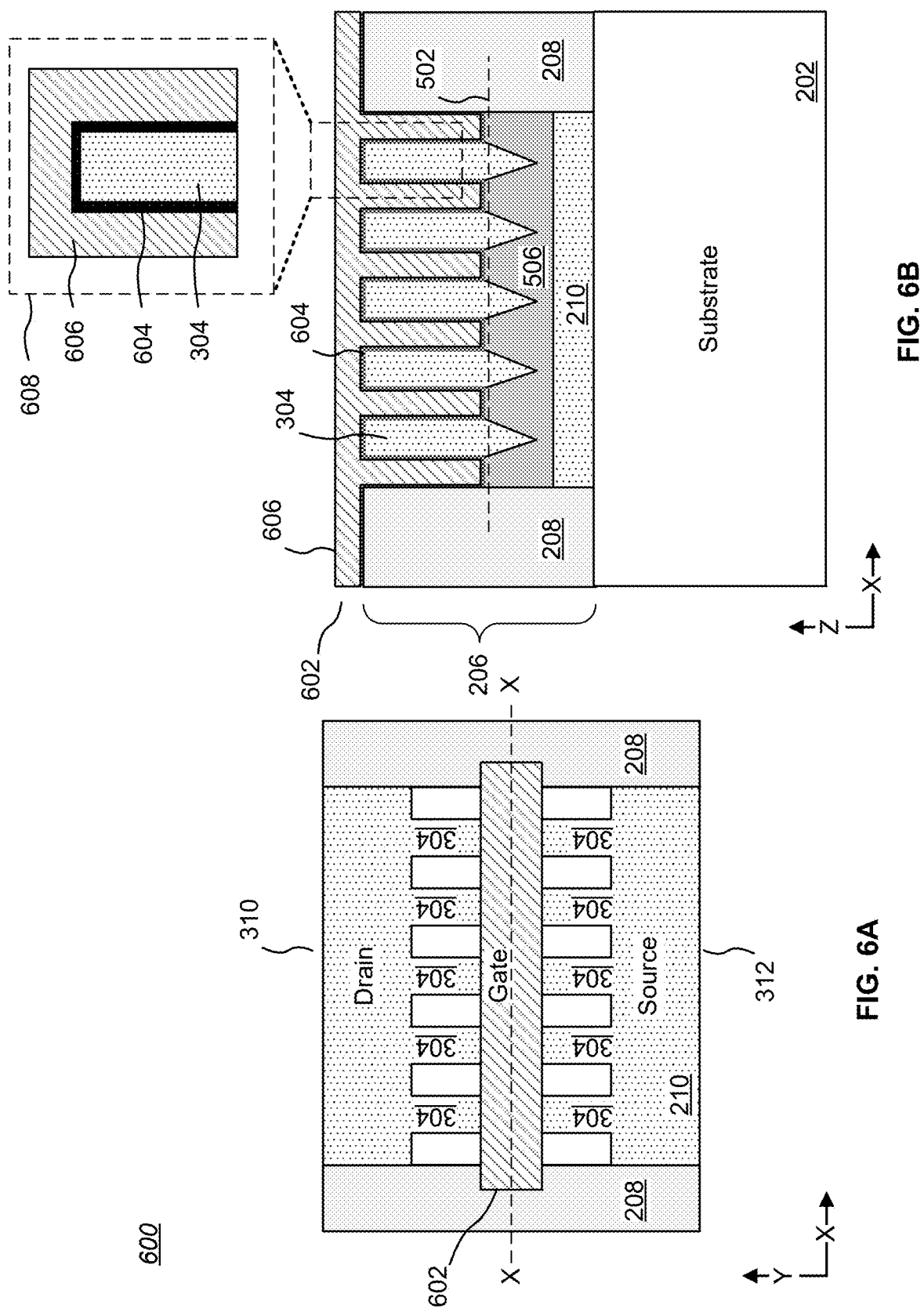
FIG. 6A is a top plan view of the first example FET substructure in an even further stage of fabrication in accordance with the present invention.
FIG. 6B is a cross-sectional view of the FET substructure taken along line X-X of FIG. 6A.

FIG. 6A is a top plan view of the first example FET substructure 600 in an even further stage of fabrication in accordance with the present invention. FIG. 6B is a cross-sectional view of the FET substructure 600 taken along line X-X of FIG. 6A. In this example, a gate structure 602 has been overlayed on the fins 304 between the first edge region 310 and the second region edge 312 of the original crystalline region 210. In the illustrated example, the first edge region 310 is now designated as the drain, while the second region edge 312 is now designated as the source.

The gate structure 602 includes a conformal coating of dielectric material 604 (e.g., $SiO_2$) formed or deposited on a section of the sides 504 of the fins 304, such as by thermal oxidation, chemical vapor deposition (CVD), atomic layer deposition (ALD), or the like. Overlaying the dielectric material 604 (commonly referred to as "gate oxide" or GOX) is a suitable gate material 606, such as polysilicon or a metal. An enlarged section 608 shows one fin 304 with the dielectric material 604 and gate material 606. Note that while FIG. 6B shows that the gate material 606 completely fills the region between fins 304, in some embodiments the gate material 606 may be a conformal layer, leaving a void between the fins 304 that may contain air or an added dielectric filler.

The gate structure 602 may be fabricated by laying down or forming a coating of dielectric material 604 over the entire surface of the IC die shown in FIG. 6A (including the exposed sides 504 of the fins 304—see FIGS. 5A-5B), following by laying down or forming the gate material 606 over the entire surface of the IC die (including over the dielectric material previously formed on the exposed sides 504 of the fins 304). The gate material 606 may then be patterned and anisotropically etched (including through the dielectric material 604) to remove all of the gate material

606 and dielectric material 604 except where the gate structure 602 is located. However, other methods of forming the gate structure 602 may be used. In some embodiments, the gate structure 602 may be a "dummy" stack created, for example, to enable source-drain epitaxy. As noted above, any gaps between the fins 304 may contain air or an added dielectric filler, such as $SiO_2$.

Figure 7:
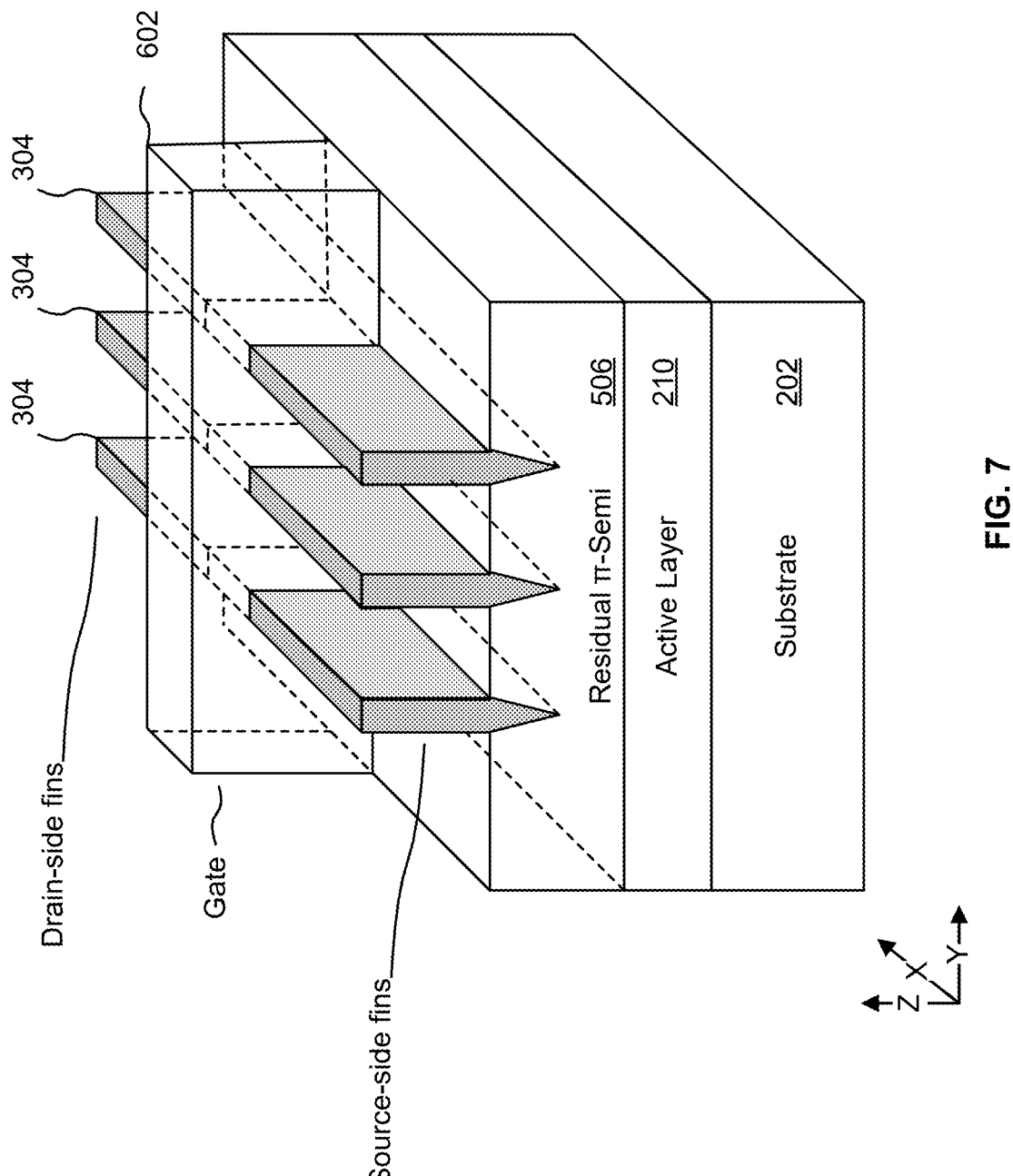
FIG. 7 is a perspective drawing of a 3-fin embodiment of the present invention showing the gate structure of FIG. 6B straddling the fins (the STIs and source/drain regions have been omitted to reduce clutter).

FIG. 7 is a perspective drawing of a 3-fin embodiment of the present invention showing the gate structure 602 of FIG. 6B straddling the fins 304 (the STIs 208 and source/drain regions have been omitted to reduce clutter).

The result is that each fin 304 will have a gate structure 602 formed on its top surface and side walls, with the fins 304 isolated at their bottoms (below line 502 in FIG. 6B), thus forming a FinFET that allows better gate biasing than a planar FET while simplifying fabrication. Further, because the π-Semi regions can be formed to significant depths, a thicker active layer 206 may be used to produce FinFETs having deeper fins than conventional FinFETs, thus allowing a reduction in IC die size.

Once the π-Semi is removed and a basic gate structure 602 (or dummy gate) formed, a number of conventional FEOL processes may be applied, such as source-drain implantation, source-drain epitaxy, ohmic contact formation, replacement metal gate (RMG) steps, etc., followed by BEOL processes such as fabrication of electrical contacts (pads), vias, insulating layers (dielectrics), metallization layers, and bonding sites for die-to-package connections.

Figures 8A, 8B:
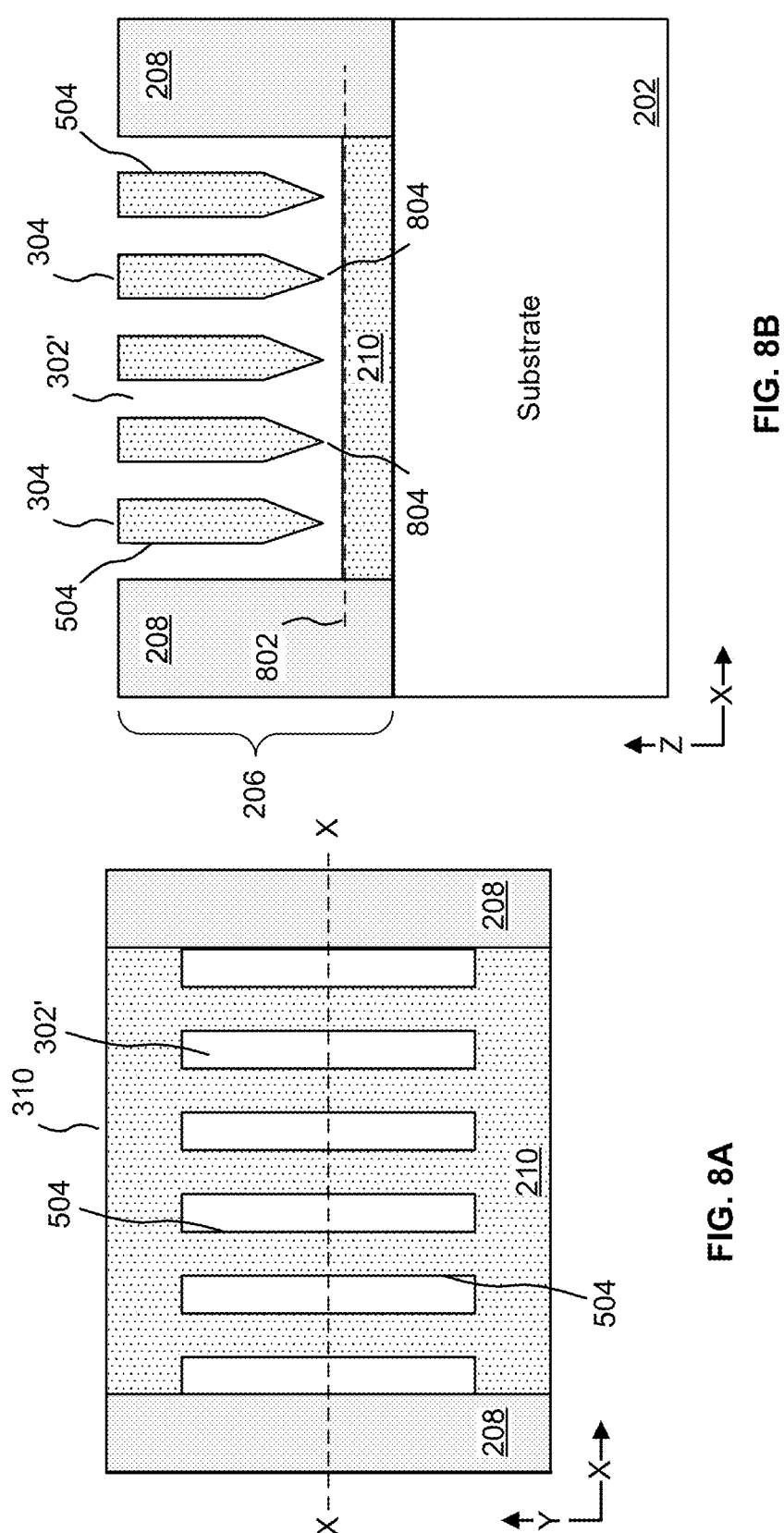
FIG. 8A is a top plan view of a second example FET substructure in a stage of fabrication in accordance with the present invention.
FIG. 8B is a cross-sectional view of the FET substructure taken along line X-X of FIG. 8A.

There are a number of variants of the processes and resulting structures shown in FIGS. 2A/2B-6A/6B. For example, FIG. 8A is a top plan view of a second example FET substructure 800 in a stage of fabrication in accordance with the present invention. FIG. 8B is a cross-sectional view of the FET substructure 800 taken along line X-X of FIG. 8A. This stage represents the completion of the processes shown in FIGS. 2A/2B-4A/5B. However, in contrast to the partial removal of π-Semi down to line 502 as shown in FIG. 5B, the π-Semi is etched down to dashed line 802, below the bottoms of the fins 304 all of the way to an unconverted portion of the crystalline region 210. Stated differently, essentially all of the π-Semi is removed. Accordingly, the fins 304 are no longer attached at their bottom sides 804 by a residual portion 506 of π-Semi to the crystalline region 210, as in FIG. 5B, but are essentially free-floating-Semi beams or "nanosheets" spanning between the first edge region 310 and the second region edge 312 of the original crystalline region 210.

Figures 9A, 9B:
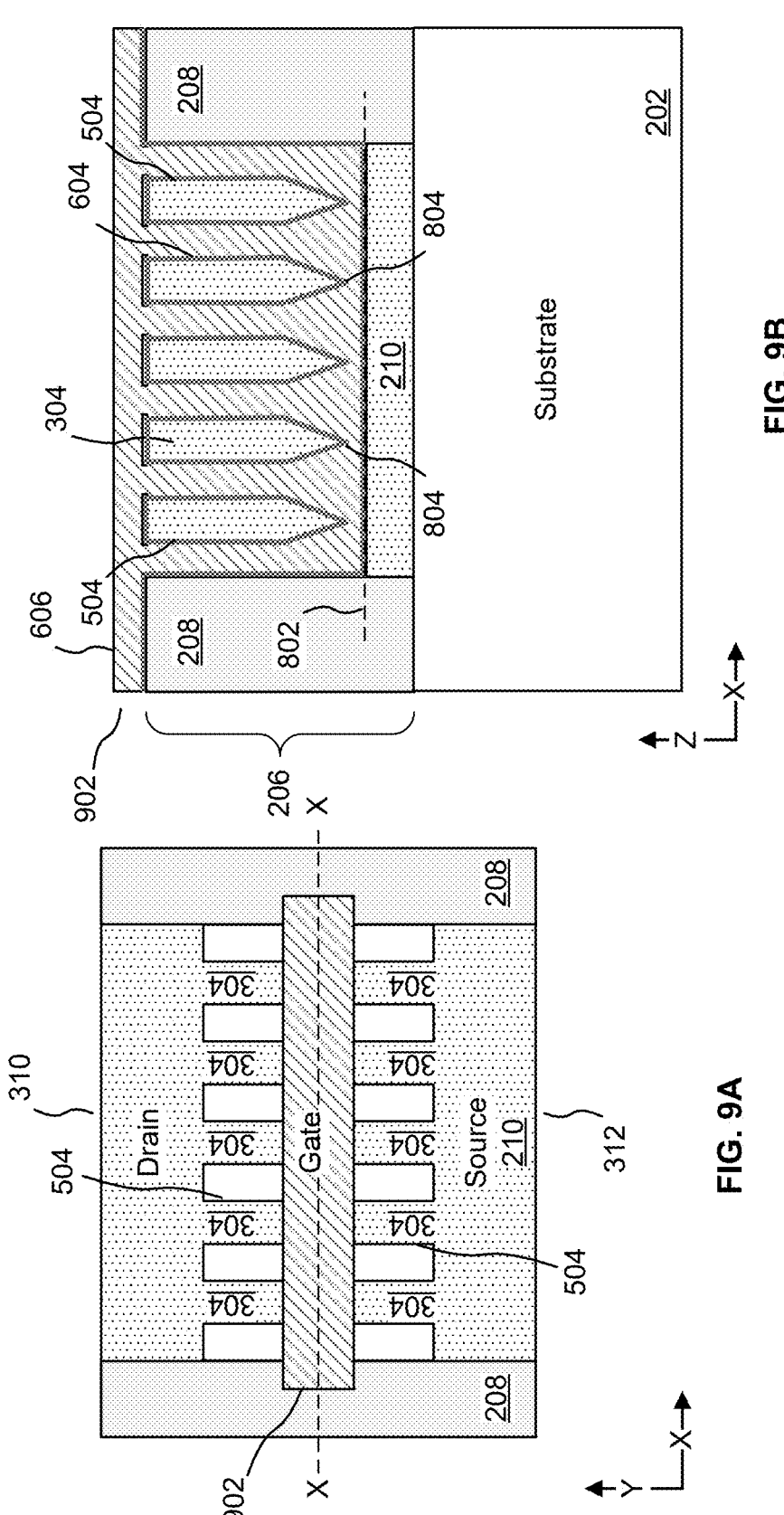
FIG. 9A is a top plan view of the second example FET substructure in a later stage of fabrication in accordance with the present invention.
FIG. 9B is a cross-sectional view of the FET substructure taken along line X-X of FIG. 9A.

Free-floating the fins 304 (now nanosheets) allows for a gate-all-around (GAA) FET architecture. For example, FIG. 9A is a top plan view of the second example FET substructure 800 in a later stage of fabrication in accordance with the present invention. FIG. 9B is a cross-sectional view of the FET substructure 900 taken along line X-X of FIG. 9A. In this example, a gate structure 902 has been overlayed on the fins 304 between the first edge region 310 and the second region edge 312 of the original crystalline region 210. The gate structure 902 includes a conformal coating of dielectric material 604 (e.g., $SiO_2$) formed or deposited on the top, sides 504, and bottom sides 804 of the fins 304. Overlaying the dielectric material 604 is a suitable gate material 606, such as polysilicon.

Once the π-Semi is removed and a basic gate structure 902 (or dummy gate) formed, a number of conventional FEOL processes may be applied, such as source-drain implantation, source-drain epitaxy, ohmic contact formation, replacement metal gate (RMG) steps, etc., followed by BEOL processes such as fabrication of electrical contacts (pads), vias, insulating layers (dielectrics), metallization layers, and bonding sites for die-to-package connections.

Figure 10:
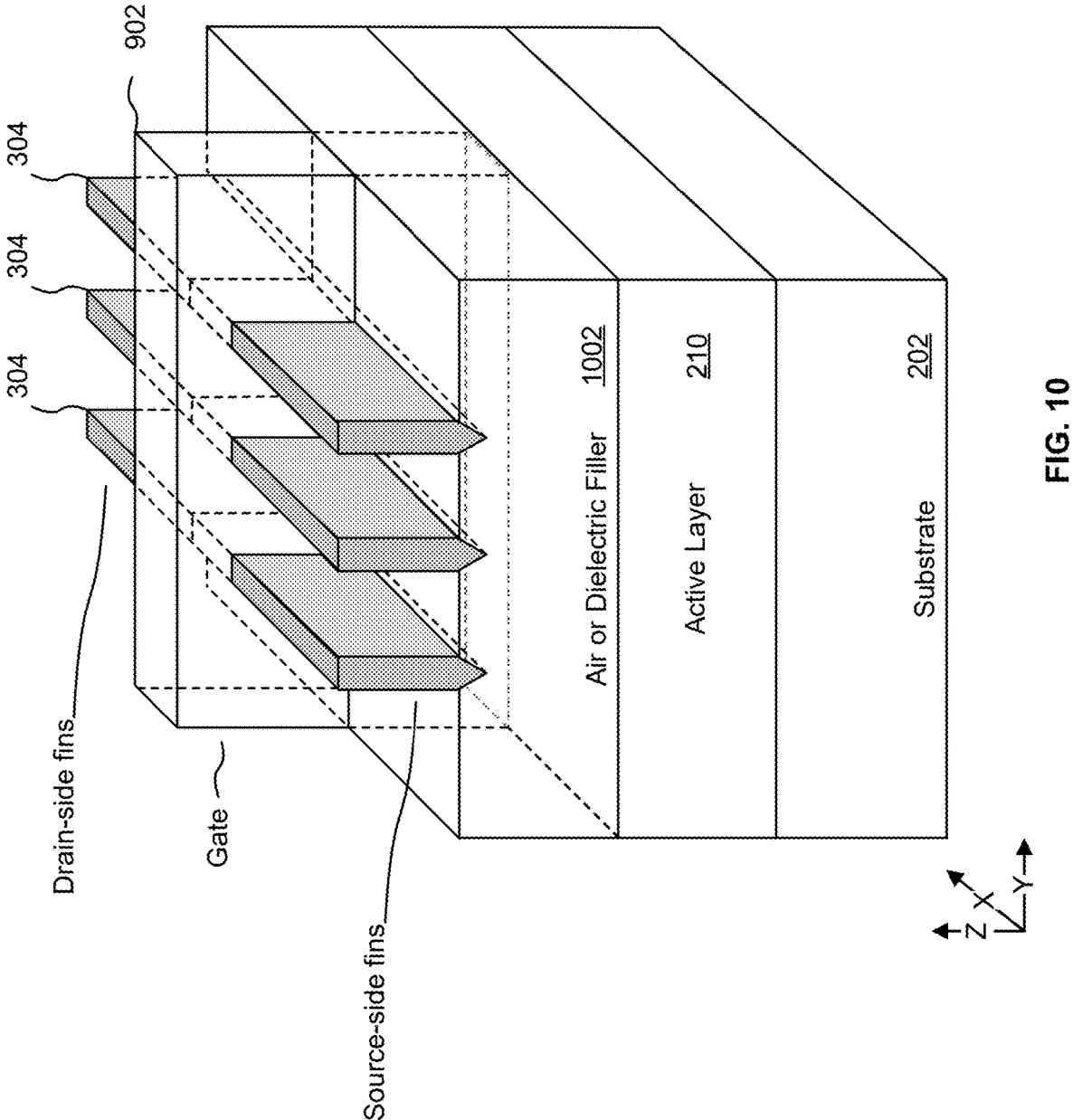
FIG. 10 is a perspective drawing of a 3-fin embodiment of the present invention showing the gate structure of FIG. 9B straddling the fins (the STIs and source/drain regions have been omitted to reduce clutter).

FIG. 10 is a perspective drawing of a 3-fin embodiment of the present invention showing the gate structure 902 of FIG. 9B straddling the fins 304 (the STIs 208 and source/drain regions have been omitted to reduce clutter). Note that the source-side fins and drain-side fins extend into a zone 1002 that may comprise, for example, air or a back-filled dielectric such as $SiO_2$.

Figures 11A, 11B:
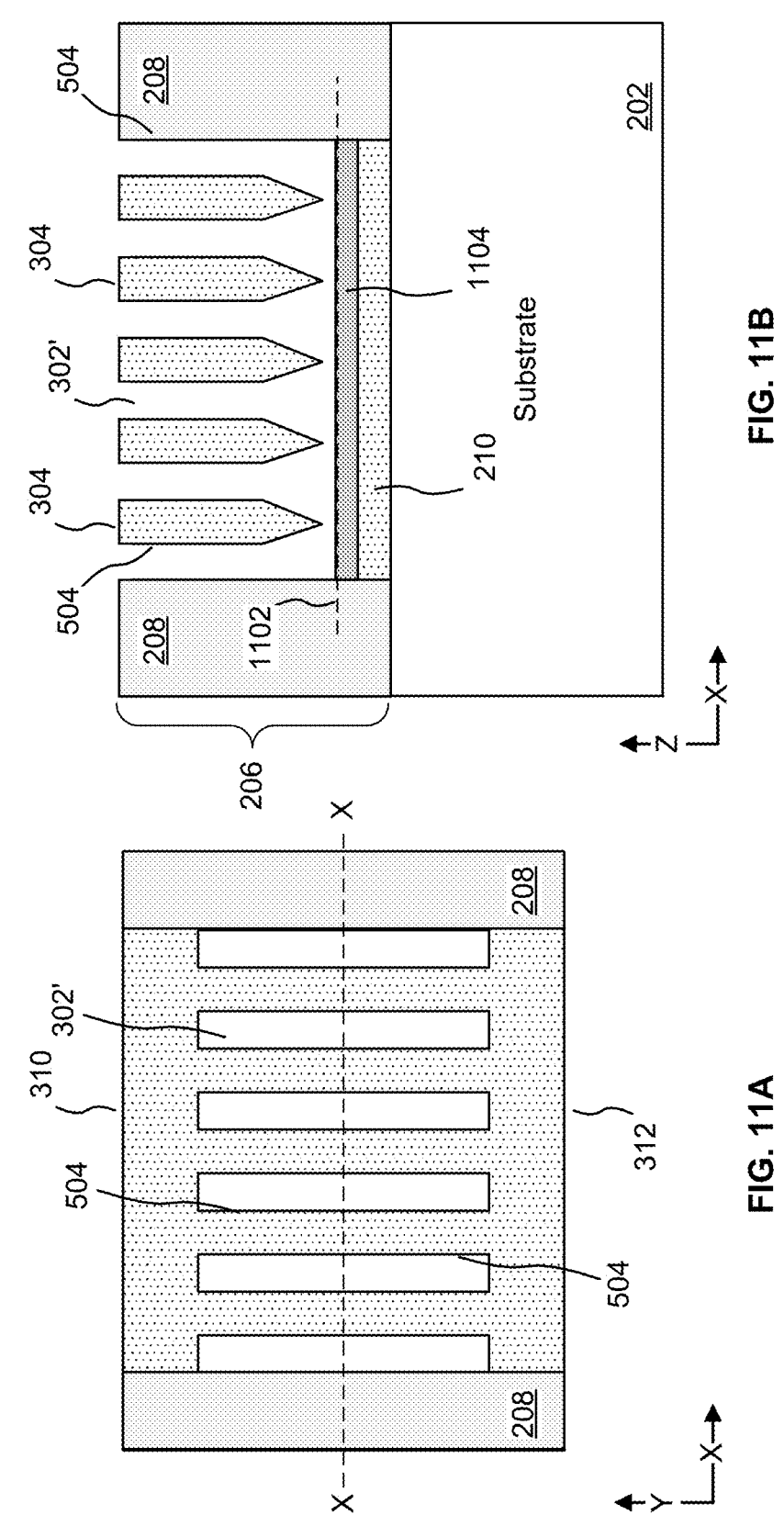
FIG. 11A is a top plan view of a third example FET substructure in a stage of fabrication in accordance with the present invention.
FIG. 11B is a cross-sectional view of the FET substructure taken along line X-X of FIG. 11A.

Another variant architecture is somewhat intermediate between the embodiment shown in FIG. 6B (FinFET) and the embodiment shown in FIG. 11B (GAAFET with no residual π-Semi). For example, FIG. 11A is a top plan view of a third example FET substructure 1100 in a stage of fabrication in accordance with the present invention. FIG. 11B is a cross-sectional view of the FET substructure 1100 taken along line X-X of FIG. 11A. This stage represents the completion of the processes shown in FIGS. 2A/2B-4A/5B. However, in contrast to the partial removal of π-Semi down to line 502 as shown in FIG. 5B, the π-Semi is etched down to dashed line 1102, below the bottoms of the fins 304 but not all of the way to an unconverted portion of the crystalline region 210. Accordingly, a residual portion 1104 of π-Semi remains below the fins 304 on top of the original crystalline region 210. It may be desirable in some embodiments to seal the tops of the pores of the residual portion 1104 of π-Semi.

The result is that the fins 304 are no longer attached at their bottom sides 804 to the residual portion 1104 of π-Semi, but are essentially free-floating π-Semi beams or "nanosheets" spanning between the first edge region 310 and the second region edge 312 of the original crystalline region 210.

As noted above, the porosity of the "cone" portion of the regions 302 (FIG. 4B) may differ from the porosity of the columnar portion of the regions 302 (i.e., the portion having a depth d). Similarly, the residual portion 1104 of π-Semi can be etched so as to exhibit a different degree of porosity. Thus, for example, the columnar portion of the regions 302 may be microporous π-Semi (high porosity) while the upper part of the cone portion of the regions 302 may be mesoporous or microporous π-Semi (low porosity) and the residual portion 1104 of π-Semi may be mesoporous or microporous π-Semi (medium porosity).

Figures 12A, 12B:
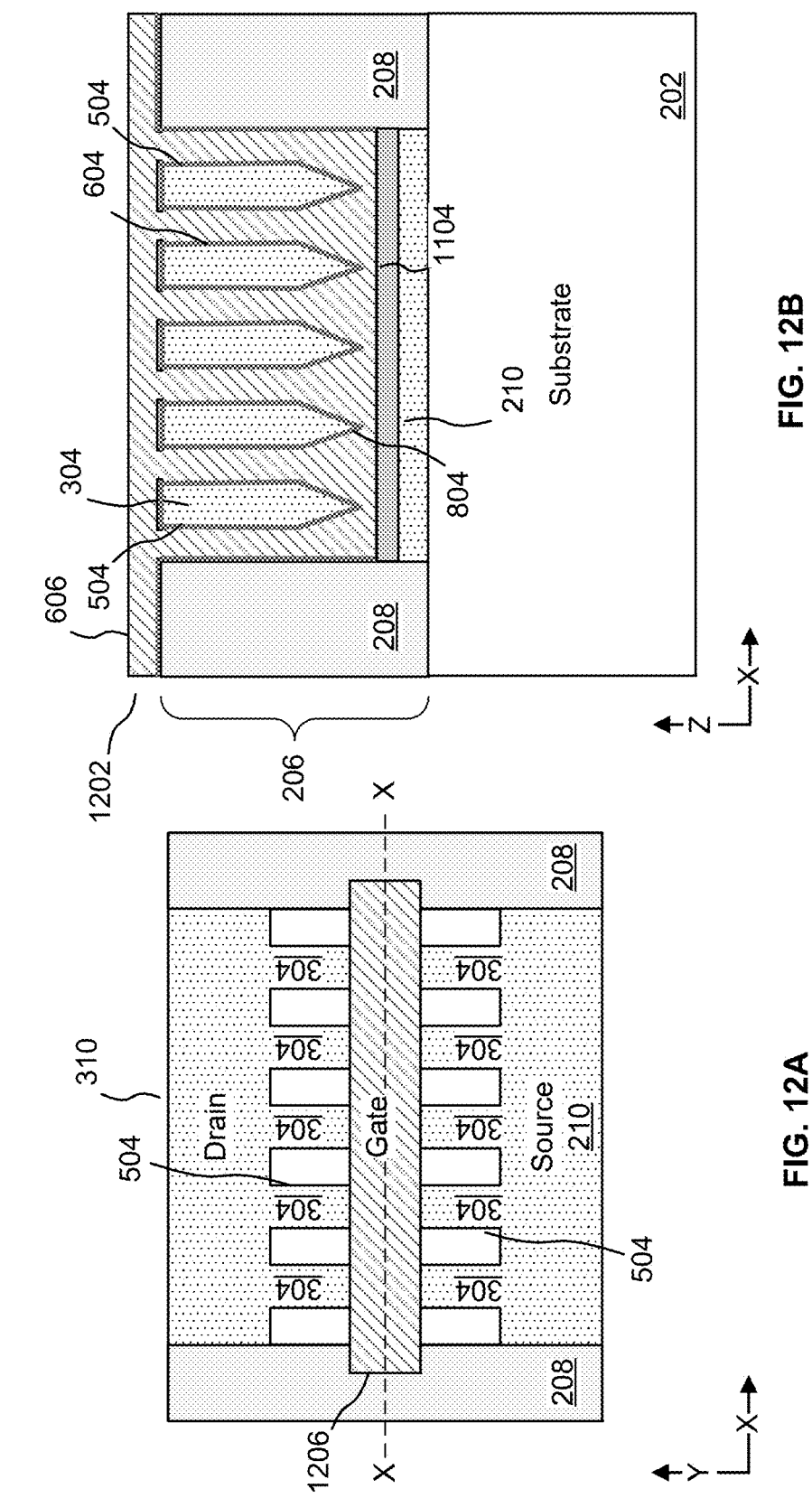
FIG. 12A is a top plan view of the second example FET substructure in a later stage of fabrication in accordance with the present invention.
FIG. 12B is a cross-sectional view of the FET substructure taken along line X-X of FIG. 12A.

FIG. 12A is a top plan view of the second example FET substructure 1200 in a later stage of fabrication in accordance with the present invention. FIG. 12B is a cross-sectional view of the FET substructure 1200 taken along line X-X of FIG. 12A. In this example, a gate structure 1202 has been overlayed on the fins 304 between the first edge region 310 and the second region edge 312 of the original crystalline region 210. The gate structure 1202 includes a conformal coating of dielectric material 604 (e.g., $SiO_2$) formed or deposited on the top, sides 504, and bottom sides 804 of the fins 304. Overlaying the dielectric material 604 is a suitable gate material 606, such as polysilicon.

Once the π-Semi is removed and a basic gate structure 1202 (or a dummy gate) formed, a number of conventional FEOL processes may be applied, such as source-drain implantation, source-drain epitaxy, ohmic contact formation, replacement metal gate (RMG) steps, etc., followed by BEOL processes such as fabrication of electrical contacts (pads), vias, insulating layers (dielectrics), metallization layers, and bonding sites for die-to-package connections.

Figure 13:
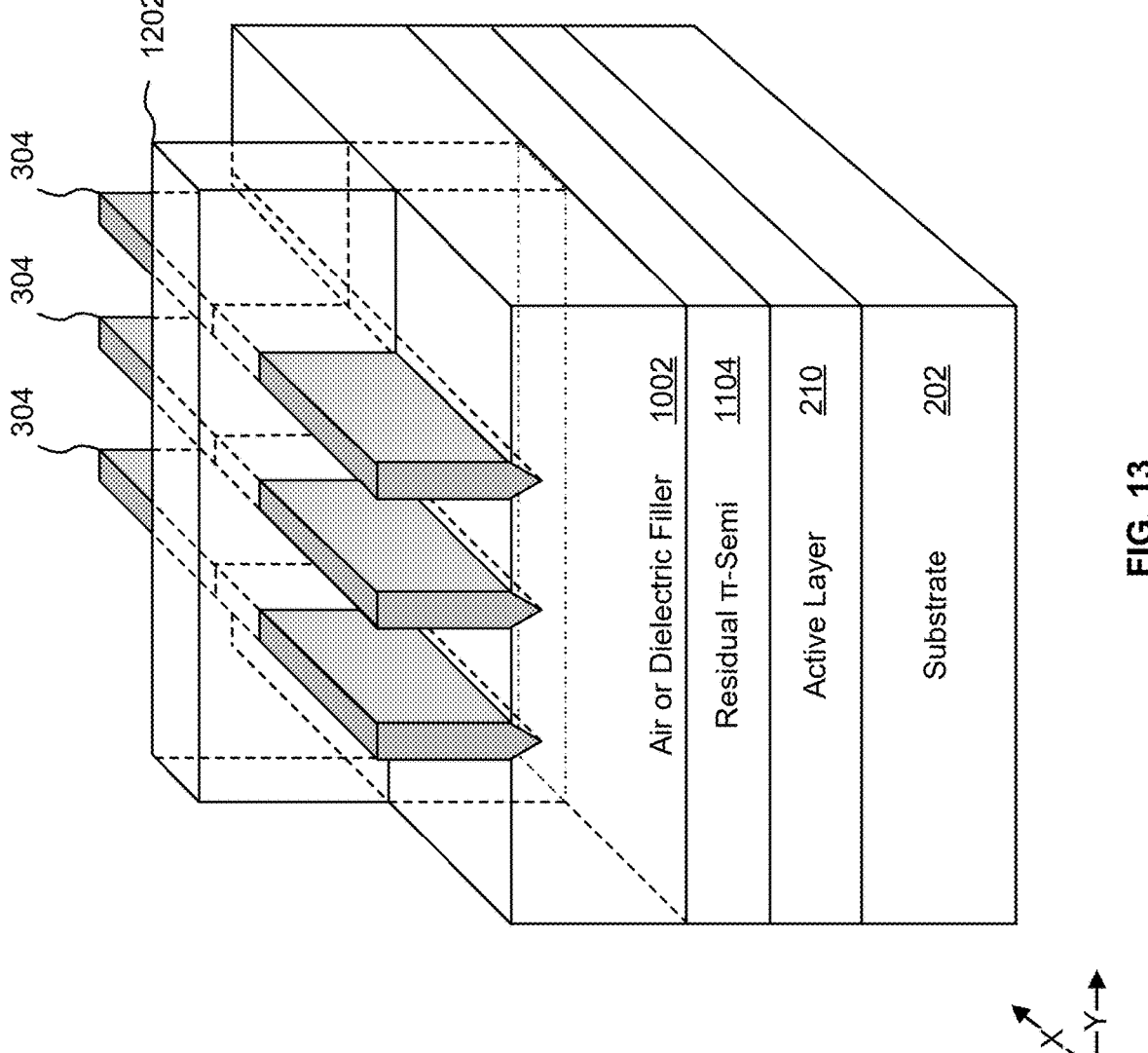
FIG. 13 is a perspective drawing of a 3-fin embodiment of the present invention showing the gate structure of FIG. 12B straddling the fins (the STIs and source/drain regions have been omitted to reduce clutter).

FIG. 13 is a perspective drawing of a 3-fin embodiment of the present invention showing the gate structure 1202 of FIG. 12B straddling the fins 304 (the STIs 208 and source/drain regions have been omitted to reduce clutter). Note that the source-side fins and drain-side fins extend into a zone 1002 that may comprise, for example, air or a back-filled dielectric such as $SiO_2$.

FIG. 13 differs from FIG. 10 by including a layer of residual π-Semi 1104. An advantage of leaving the residual portion 1104 of π-Semi as a "floor" below the fins 304 is that it provides better isolation of the gate structure 1202 from the underlying original crystalline region 210 (if any) and the substrate 202, thereby reducing capacitive and resistive losses.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 14:
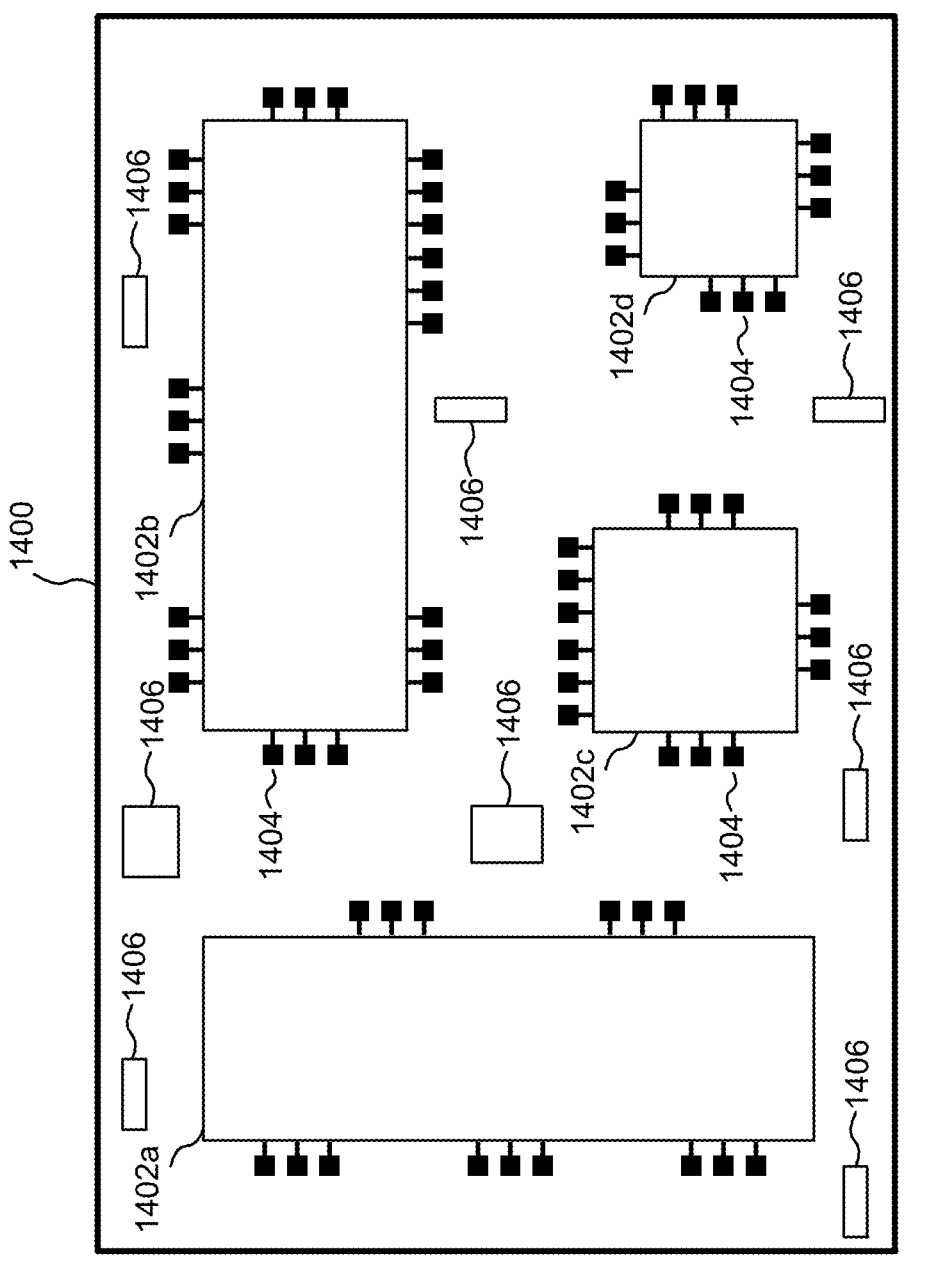
FIG. 14 is a top plan view of a substrate that may be, for example, a printed circuit board or chip module substrate (e.g., a thin-film tile).

As one example of further integration of embodiments of the present invention with other components, FIG. 14 is a top plan view of a substrate 1400 that may be, for example, a printed circuit board or chip module substrate (e.g., a thin-film tile). In the illustrated example, the substrate 1400 includes multiple ICs 1402a-1402d having terminal pads 1404 which would be interconnected by conductive vias and/or traces on and/or within the substrate 1400 or on the opposite (back) surface of the substrate 1400 (to avoid clutter, the surface conductive traces are not shown and not all terminal pads are labelled). The ICs 1402a-1402d may embody, for example, signal switches, active and/or passive filters, amplifiers (including one or more LNAs), and other circuitry. For example, IC 1402b may incorporate one or more instances of a circuit that includes FinFETs and/or GAAFETs fabricated in accordance with the teachings of this disclosure.

The substrate 1400 may also include one or more passive devices 1406 embedded in, formed on, and/or affixed to the substrate 1400. While shown as generic rectangles, the passive devices 1406 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 1400 to other passive devices 1406 and/or the individual ICs 1402a-1402d. The front or back surface of the substrate 1400 may be used as a location for the formation of other structures.

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

FIG. 15 is a process flow chart 1500 showing one generalized method for fabricating FETs in accordance with the teachings of this disclosure. The method includes: patterning an IC die to outline one or more regions of crystalline semiconductor material in the outline of a fin or nanosheet (Block 1502); converting the outlined regions of crystalline semiconductor to π-Semi having essentially vertical walls (Block 1504); further converting the outlined regions of crystalline semiconductor to π-Semi having flared walls (Block 1506); then selecting one of these options: etching the π-Semi to define fins (Block 1508a), etching the π-Semi to define nanosheets with a residual π-Semi floor (Block 1508b), or etching the π-Semi to define nanosheets with no residual π-Semi floor (Block 1508c); forming a gate structure over the fins or around the nanosheets (Block 1510); completing FEOL FET structures (e.g., source, drain, contacts, etc.) (Block 1512); and performing BEOL processes (e.g., to fabricate a superstructure on the IC die) (Block 1514).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, semiconductor-on-insulator (SOI), and semiconductor-on-sapphire (SOS). Unless otherwise noted above, embodiments of the invention may be implemented in other transistor technologies having comparable characteristics using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method of fabricating a FinFET, including:
   (a) patterning an IC die to outline one or more regions of crystalline semiconductor material in the outline of a fin;
   (b) converting the one or more outlined regions of crystalline semiconductor to porous semiconductor (π-Semi) having essentially vertical walls to a selected depth d;
   (c) further converting the one or more outlined regions of crystalline semiconductor below the selected depth d to π-Semi having flared walls;
   (d) etching the π-Semi to define fins;
   (e) forming a gate structure over the fins.

2. The method of claim 1, further including fabricating a source and a drain adjacent the gate structure.

3. The method of claim 2, further including fabricating electrical contacts to the source, gate, and drain.

4. The method of claim 3, further including fabricating a superstructure on the IC die.

5. The method of claim 1, wherein the crystalline semiconductor material is one of silicon, germanium, or a silicon-germanium alloy.

6. A method of fabricating a gate-all-around FET, including:
   (a) patterning an IC die to outline one or more regions of crystalline semiconductor material in the outline of a nanosheet;
   (b) converting the one or more outlined regions of crystalline semiconductor to porous semiconductor (π-Semi) having essentially vertical walls to a selected depth d;
   (c) further converting the outlined regions of crystalline semiconductor below the selected depth d to π-Semi having flared walls;
   (d) etching the π-Semi to define nanosheets with no residual π-Semi floor;
   (e) forming a gate structure around the nanosheets.

7. The method of claim 6, further including fabricating a source and a drain adjacent the gate structure.

8. The method of claim 7, further including fabricating electrical contacts to the source, gate, and drain.

9. The method of claim 8, further including fabricating a superstructure on the IC die.

10. The method of claim 6, wherein the crystalline semiconductor material is one of silicon, germanium, or a silicon-germanium alloy.

11. A method of fabricating a gate-all-around FET, including:
   (a) patterning an IC die to outline one or more regions of crystalline semiconductor material in the outline of a nanosheet;
   (b) converting the one or more outlined regions of crystalline semiconductor to porous semiconductor (π-Semi) having essentially vertical walls to a selected depth d;
   (c) further converting the one or more outlined regions of crystalline semiconductor below the selected depth d to π-Semi having flared walls;
   (d) etching the π-Semi to define nanosheets with a residual π-Semi floor;
   (e) forming a gate structure around the nanosheets.

12. The method of claim 11, further including fabricating a source and a drain adjacent the gate structure.

13. The method of claim 12, further including fabricating electrical contacts to the source, gate, and drain.

14. The method of claim 13, further including fabricating a superstructure on the IC die.

15. The method of claim 11, wherein the crystalline semiconductor material is one of silicon, germanium, or a silicon-germanium alloy.

16. A field-effect transistor, including:
   (a) a region of crystalline semiconductor material including a source region and a drain region;
   (b) at least one vertical fin of the crystalline semiconductor material spanning between the source region and the drain region, the at least one vertical fin having a top, sidewalls, and a bottom;
   (c) a gate structure overlaying the top and sidewalls of the at least one vertical fin between the source region and the drain region; and (d) a porous semiconductor region separating the bottom of the at least one vertical fin from other underlying regions.

17. The field-effect transistor of claim 16, wherein the crystalline semiconductor material is one of silicon, germanium, or a silicon-germanium alloy.

18. A field-effect transistor, including:

(a) a region of crystalline semiconductor material including a source region and a drain region;

(b) at least one vertical nanosheet of the crystalline semiconductor material spanning horizontally between the source region and the drain region, the at least one vertical nanosheet having a top, vertical sidewalls, and a bottom;

(c) a gate structure surrounding the top, vertical sidewalls, and bottom of the at least one vertical nanosheet between the source region and the drain region; and (d) a porous semiconductor region separating the bottom of the at least one vertical nanosheet from other underlying regions.

19. The field-effect transistor of claim 18, wherein the crystalline semiconductor material is one of silicon, germanium, or a silicon-germanium alloy.

* * * * *